(12) United States Patent
Luoh et al.

(10) Patent No.: US 7,846,835 B2
(45) Date of Patent: Dec. 7, 2010

(54) CONTACT BARRIER LAYER DEPOSITION PROCESS

(75) Inventors: Tuung Luoh, Taipei (TW); Chin-Ta Su, Yunlin (TW); Ta-Hung Yang, Hsinchu (TW); Kuang-Chao Chen, Hsinchu (TW)

(73) Assignee: Macronix International Co. Ltd. (TW)

( * ) Notice: Subject to any disclaimer, the term of this patent is extended or adjusted under 35 U.S.C. 154(b) by 11 days.

(21) Appl. No.: 11/950,319

(22) Filed: Dec. 4, 2007

(65) Prior Publication Data

US 2008/0132061 A1    Jun. 5, 2008

Related U.S. Application Data

(63) Continuation-in-part of application No. 11/565,355, filed on Nov. 30, 2006.

(51) Int. Cl.
*H01L 21/4763* (2006.01)
(52) U.S. Cl. .................. 438/648; 438/625; 438/656; 257/E21.584
(58) Field of Classification Search .......... 438/625, 438/627–629, 643–644, 648, 653, 654, 656, 438/678–681; 257/E21.584
See application file for complete search history.

(56) References Cited

U.S. PATENT DOCUMENTS

| 6,271,592 | B1 * | 8/2001 | Kim et al. | 257/751 |
| 6,297,555 | B1 * | 10/2001 | Zhao et al. | 257/758 |
| 2007/0080459 | A1 * | 4/2007 | Seok | 257/751 |
| 2008/0132060 | A1 * | 6/2008 | Luoh et al. | 438/653 |

* cited by examiner

*Primary Examiner*—Thanhha Pham
(74) *Attorney, Agent, or Firm*—Baker & McKenzie LLP (57) ABSTRACT

A method for depositing a barrier layer onto a substrate is disclosed. A layer of titanium (Ti) is deposited onto the substrate using an ionized metal plasma (IMP) physical vapor deposition process. The IMP process includes: generating gaseous ions, accelerating the gaseous ions towards a titanium target, sputtering the titanium atoms from the titanium target with the gaseous ions, ionizing the titanium atoms using a plasma, and depositing the ionized titanium atoms onto the substrate to form the layer of Ti. A first layer of titanium nitride (TiN) is deposited onto the layer of Ti using a metal organic chemical vapor deposition (MOCVD) process. A second layer of TiN is deposited onto the first layer of TiN using a thermal chemical vapor deposition process. The newly completed barrier layer is annealed in the presence of nitrogen at a temperature of between about 500° C. to about 750° C.

39 Claims, 6 Drawing Sheets

CONTACT BARRIER LAYER DEPOSITION PROCESS

APPLICATION FOR CLAIM OF PRIORITY

This application claims priority as a Continuation-In-Part under 35 U.S.C. §120 to U.S. patent application Ser. No. 11/565,355 filed Nov. 30, 2006 and entitled "New Contact Barrier Layer Deposition Process." The disclosure of the above-identified application is incorporated herein by reference as if set forth in full.

BACKGROUND

1. Field of the Invention

The embodiments disclosed in this application generally relate to processes for depositing a contact barrier layer on an integrated circuit (IC) substrate.

2. Background of the Invention

In the formation of integrated circuit structures, an insulating layer is formed over active devices, or over a patterned underlying metal interconnect layer, and vertical openings are then formed through this insulating layer to provide electrical communication from the upper surface of the insulating layer to the underlying active device or electrical interconnect. Such openings are then filled with an electrically conductive material to provide electrical connection between the underlying elements and conductive materials, such as a metal interconnect, subsequently formed on the surface of the insulating material. In the fabrication of both horizontal and vertical interconnects, barrier layers are typically deposited over the patterned surface of a substrate to provide a barrier to prevent diffusion between adjacent materials.

Conventional barrier layers include materials such as titanium nitride (TiN), tantalum nitride (TaN) and tungsten nitride (TuN). The materials are deposited using processes such as physical vapor deposition (PVD) (e.g., ionized metal plasma PVD, sputtering, etc.) and chemical vapor deposition (CVD) (e.g., plasma enhanced CVD, metal-organic CVD, etc.). TiN layers, in particular, have been widely employed in semiconductor manufacturing as a "diffusion barrier" layer; that is, it is placed between two metal or semiconductor layers to prevent intermixing and undesired interactions, while still permitting electrical current to flow. TiN is a hard, dense, refractory material with unusually high electrical conductivity. Ideally, the processes that are used to deposit the TiN barrier layer will not impact the reliability of the resulting IC formed and generate a high reactive sticking coefficient (Rc) for TiN to the silicon (Si) substrate.

Conventional methods for depositing TiN have been shown to adversely impact the reliability of the resulting ICs formed. This is due to a variety of factors including: impurities resulting from the deposition processes themselves, and cross reactions between the non-TiN material layers on the Si substrate and byproducts from the deposition processes. Additionally, the low to moderate Rc of these traditional processes do not always result in uniform TiN layers being deposited across the Si substrate surfaces.

SUMMARY

Methods and systems for depositing a contact barrier layer onto a substrate are disclosed.

In one aspect, a system for depositing a barrier layer onto a substrate is disclosed. The system includes an ionized metal plasma chamber, a metal organic chemical vapor deposition chamber, and a thermal chemical vapor deposition chamber. The ionized metal plasma chamber is configured to deposit a layer of titanium (Ti) onto the substrate. The metal organic chemical vapor deposition chamber is operatively interfaced with the ionized metal plasma chamber and is configured to deposit a first layer of TiN onto the layer of Ti. The thermal chemical vapor deposition chamber is operatively interfaced with the metal organic chemical vapor deposition chamber and is configured to deposit a second layer of TiN onto the first layer of TiN. The system, optionally, includes an annealing chamber that is configured to supply nitrogen and heat the barrier layer to a temperature of between about 500° C. to about 750° C.

In a different aspect, a method for depositing a barrier layer onto a substrate is disclosed. A layer of titanium (Ti) is deposited onto the substrate using an ionized metal plasma (IMP) physical vapor deposition process. The IMP process includes: generating gaseous ions, accelerating the gaseous ions towards a titanium target, sputtering the titanium atoms from the titanium target with the gaseous ions, ionizing the titanium atoms using a plasma, and depositing the ionized titanium atoms onto the substrate to form the layer of Ti. A first layer of titanium nitride (TiN) is deposited onto the layer of Ti using a metal organic chemical vapor deposition (MOCVD) process. A second layer of TiN is deposited onto the first layer of TiN using a thermal chemical vapor deposition process. The newly completed barrier layer is annealed in the presence of nitrogen at a temperature of between about 500° C. to about 750° C.

In a further aspect, a method for depositing a barrier layer onto a substrate is disclosed. A layer of titanium (Ti) is deposited onto the substrate using an ionized metal plasma (IMP) physical vapor deposition process. A first layer of titanium nitride (TiN) is deposited onto the Ti layer using a MOCVD process. The MOCVD process includes: supplying a gaseous metal organic precursor compound and ammonia to the reaction chamber holding the substrate, reacting the gaseous metal organic precursor compound with ammonia to produce TiN, depositing TiN onto the layer of Ti to form the first layer of TiN, and supplying a gas mixture and a quantity of plasma to the reaction chamber to remove impurities from the first layer of TiN. A second layer of TiN is deposited onto the first layer of TiN using a thermal chemical vapor deposition process.

In another aspect, a method for depositing a barrier layer onto a substrate is disclosed. A layer of titanium (Ti) is deposited onto the substrate using an IMP physical vapor deposition process. A first layer of titanium nitride (TiN) is deposited onto the Ti layer using a MOCVD process. A second layer of TiN is deposited onto the first layer of TiN using a thermal chemical vapor deposition (CVD) process. The thermal CVD process includes: supplying titanium tetrachloride ($TiCl_4$) gas and ammonia to a reaction chamber holding the substrate, heating the reaction chamber to a set temperature, reacting the $TiCl_4$ gas with ammonia to produce TiN, and depositing TiN onto the first layer of TiN to form the second layer of TiN.

In still another aspect, a method for depositing a barrier layer onto a substrate is disclosed. A layer of titanium (Ti) is deposited onto the substrate using a self ionized metal plasma physical vapor deposition process (SIP). A first layer of titanium nitride (TiN) is deposited onto the layer of Ti using a self ionized metal plasma physical vapor deposition process with nitride gas (N2) kept from atmosphere. A second layer of TiN is deposited onto the first layer of TiN using a thermal chemical vapor deposition process.

In still another aspect, a method for depositing a barrier layer onto a substrate is disclosed. A layer of titanium (Ti) is deposited onto the substrate using an ionized metal plasma physical vapor deposition process, wherein the layer of Ti has a thickness of between about 10 angstroms (Å) and about 1000 Å. A first layer of titanium nitride (TiN) is deposited onto the layer of Ti using a metal organic chemical vapor deposition process, wherein the first layer of TiN has a thickness of between about 1 Å and about 100 Å. A second layer of TiN is deposited onto the first layer of TiN using a thermal chemical vapor deposition process, wherein the second layer of TiN has a thickness of between about 10 Å and about 750 Å.

These and other features, aspects, and embodiments of the invention are described below in the section entitled "Detailed Description."

BRIEF DESCRIPTION OF THE DRAWINGS

For a more complete understanding of the principles disclosure herein, and the advantages thereof, reference is now made to the following descriptions taken in conjunction with the accompanying drawings, in which.

DETAILED DESCRIPTION

An invention is described for methods and systems for depositing a contact barrier layer onto a substrate. It will be obvious, however, that the embodiments described can be practiced without some or all of these specific details. In other instances, well known process operations have not been described in detail in order not to unnecessarily obscure the present embodiments.

As used herein, an ion is a charged chemical species that is created electrically neutral and achieve their status as an ion by loss (or addition) of an electron. The process of converting into ions and the state of being ionized is termed ionization. A plasma is typically an ionized gas that is created and sustained by applying a voltage between two electrodes. In one embodiment, the plasma is created by applying a radio frequency (RF) voltage. In another embodiment, the plasma is created by applying a direct current (DC) voltage. In still another embodiment, the plasma is created by applying an alternating current (AC) voltage. It should be understood, however, that a plasma can conceivably be created using any conventional applied voltage method available as long as the voltage is sufficient to ionize the targeted chemical species.

A semiconductor substrate can be made of any silicon-based material. In one embodiment, the substrate is a semiconductor wafer, which is a thin slice of semiconductor material, such as a silicon (Si) crystal, upon which microcircuits are constructed by diffusion and deposition of various materials. In this document, the terms integrated circuit (IC) substrate, semiconductor substrate and semiconductor wafer are used inter-changeably.

Figure 1:
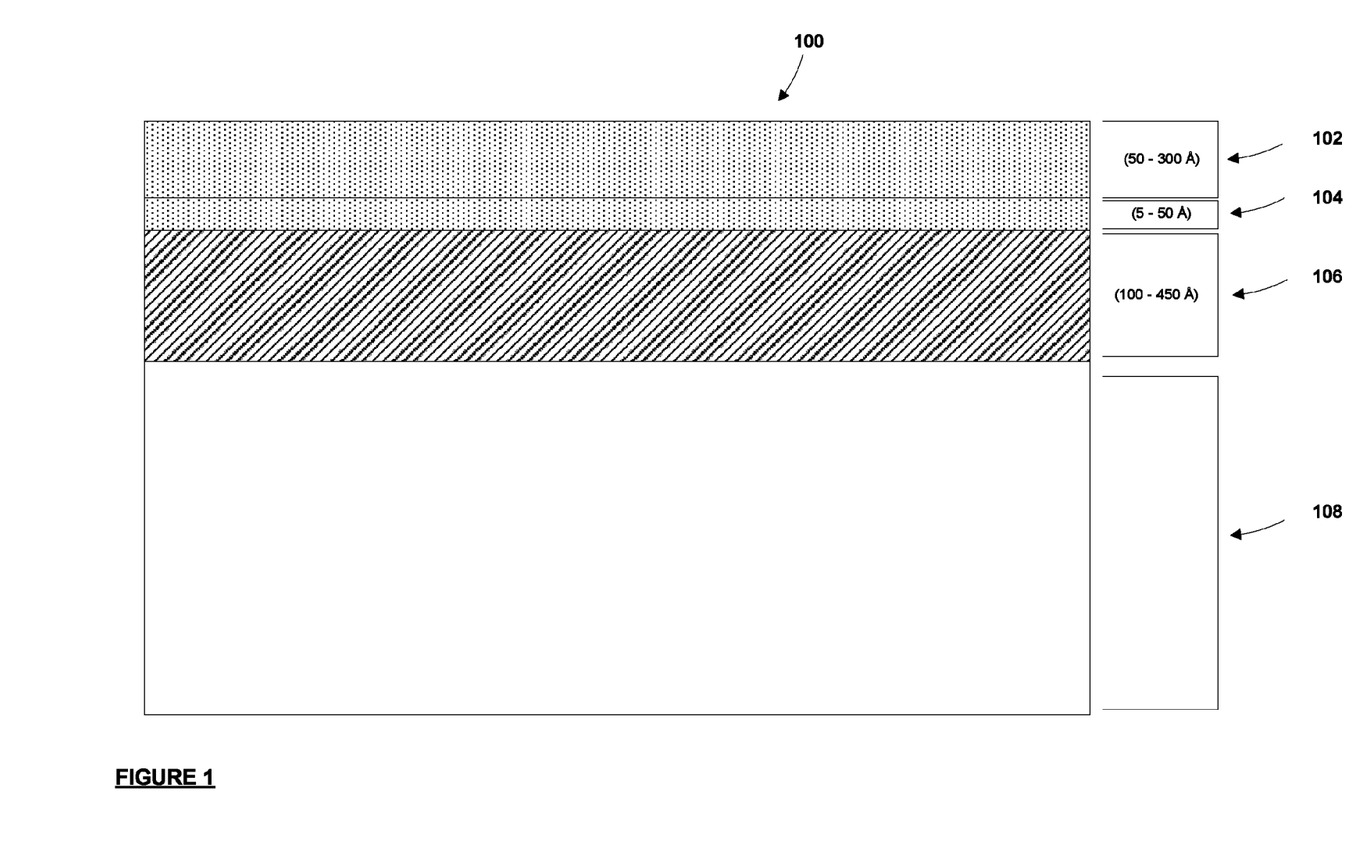
FIG. 1 is a cross-sectional illustration of the various sub-layers of material that form a barrier layer over a semiconductor substrate, in accordance with one embodiment.

FIG. 1 is a cross-sectional illustration of the various sub-layers of material that form a barrier layer over a semiconductor substrate, in accordance with one embodiment. As depicted herein, the barrier layer 100 is comprised of overlapping layers of materials including silicon 108, a titanium layer 106, a first layer of titanium nitride 104 and a second layer of titanium nitride 102. Typically, the titanium layer 106 is comprised of titanium silicide ($TiSi_2$) and its equivalent analogues. In one embodiment, the thickness of the titanium (Ti) layer 106 is between about 10 angstroms (Å) and about 1000 Å. In another embodiment, the thickness of the Ti layer 106 is between about 50 Å and about 750 Å. In still another embodiment, the thickness of the Ti layer 106 is between about 100 Å and about 450 Å. It should be appreciated, however, that the Ti layer 106 can be formed to any thickness as long as the Ti layer 106 does not impair the function or reliability of the IC components defined on the semiconductor substrate. In one embodiment, the Ti layer 106 is formed using an ionized metal plasma (IMP) deposition process, or using a self ionized metal plasma physical vapor deposition process (SIP).

In one embodiment, the thickness of the first titanium nitride (TiN) layer 104 is between about 1 Å and about 100 Å. In another embodiment, the thickness of the first TiN layer 104 is between about 5 Å and about 300 Å. In still another embodiment, the thickness of the first TiN layer 104 is between about 10 Å and about 25 Å. It should be understood, however, that the first TiN layer 104 can be formed to any thickness as long as the first TiN layer 104 does not impair the function or reliability of the IC components defined on the semiconductor substrate.

In one embodiment, the thickness of the second TiN layer 102 is between about 10 Å and about 750 Å. In another embodiment, the thickness of the second TiN layer 102 is between about 25 Å and about 500 Å. In still another embodiment, the thickness of the second TiN layer 102 is between about 50 Å and about 300 Å. It should be appreciated, however, that the second TiN layer 102 can be formed to any thickness as long as the second TiN layer 102 does not impair the function or reliability of the IC components (e.g., metal interconnects, etc.) defined on the semiconductor substrate. The primary difference between the first TiN layer 104 and the second TiN 102 is in the deposition process utilized to form the layers. For example, in one embodiment, the first TiN layer 104 is formed using a metal organic chemical vapor deposition (MOCVD) process or using a self ionized metal plasma physical vapor deposition process with nitride gas (SIP with N2); and the second TiN layer 102 is formed using a thermal CVD process with $TiCl_4$.

There are several inherent advantages to forming a contact barrier layer 100 onto a semiconductor substrate with the above described "mixed type" processes (i.e., ionized metal plasma deposition, MOCVD, and thermal CVD), materials (i.e., Ti and TiN), and structural features (i.e., Ti/TiN/TiN). One advantage is increased reliability in the resulting IC devices that are produced from the semiconductor substrate. Depositing a Ti layer 106 onto the Si 108 surface of the semiconductor substrate using the ionized plasma deposition process instead of the other more conventional methods (i.e., plasma enhanced chemical vapor deposition using TiCl$_4$) results in a better sticking coefficient (R$_c$) for Ti 106 onto the Si 108 surface. This is primarily the result of the ionized plasma deposition process being less sensitive (i.e., reactive) to the Si 108 surfaces of the semiconductor substrate than the plasma enhanced chemical vapor deposition process using TiCl$_4$.

Further, forming a TiN layer using the MOCVD process alone results in a TiN layer with a high level of impurities are difficult to process out in later processing steps. This is primarily due to reactive byproducts formed from the precursor compounds, such as tetrakis dimethylamino titanium (TDMAT) or tetrakis diethylamido titanium (TDEAT), used in the MOCVD TiN process. Forming a TiN layer using the thermal CVD with TiCl$_4$ process alone results in corrosive byproducts (i.e., HC1) that can etch and damage the metal disconnects defined on the semiconductor substrate or result in particulate contamination to be deposited on the substrate surface. By using a "mixed process" to deposit the Ti/TiN layers onto the semiconductor substrate, all the process issues described above are essentially traversed.

Figure 2:
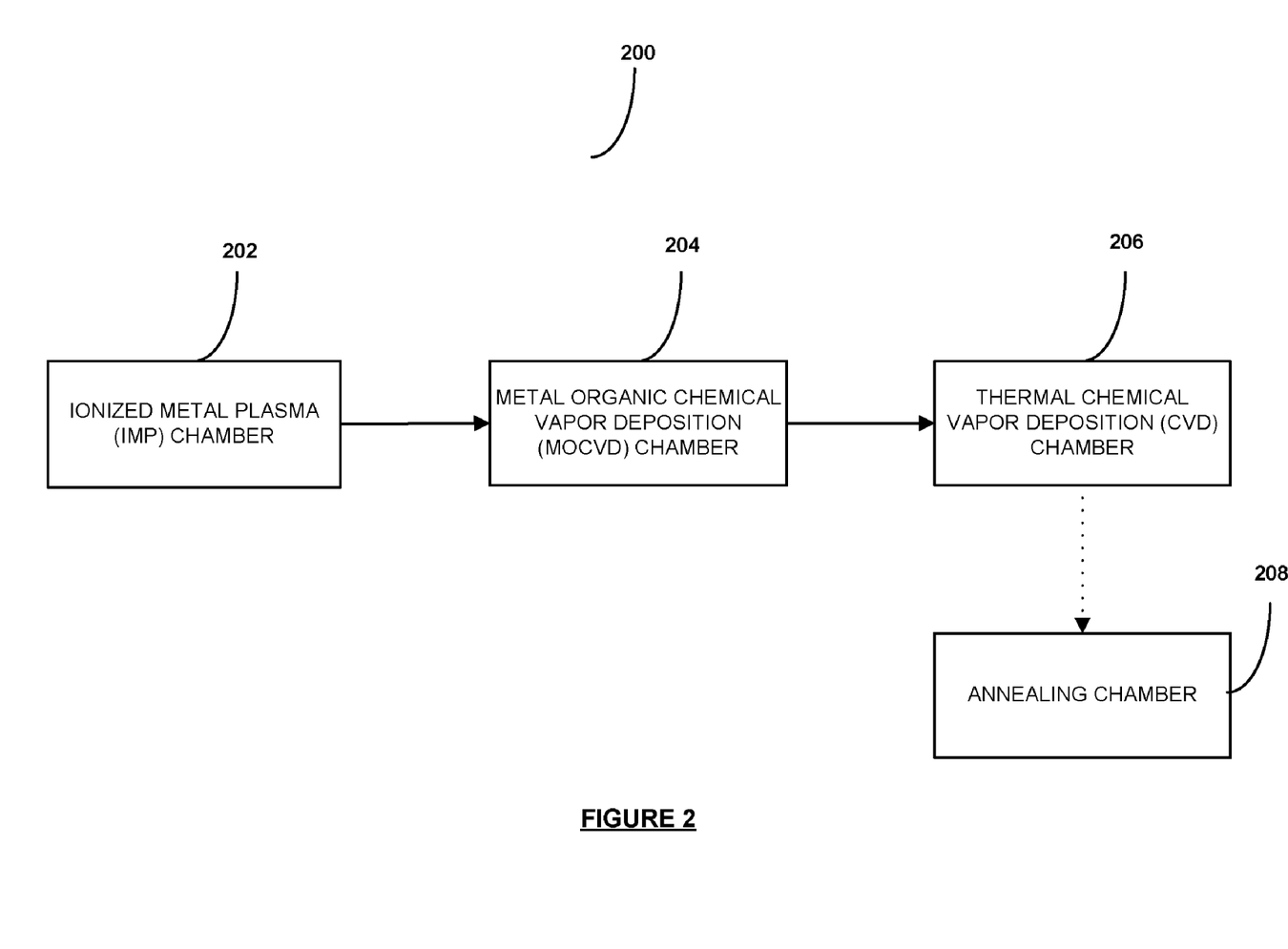
FIG. 2 is a top level illustration of a system for depositing a "mixed type" contact barrier layer onto a semiconductor substrate, in accordance with one embodiment.

FIG. 2 is a top level illustration of a system for depositing a "mixed type" contact barrier layer onto a semiconductor substrate, in accordance with one embodiment. In this illustration, the system 200 includes an IMP chamber 202, a MOCVD chamber 204, a thermal chemical vapor deposition (CVD) chamber 206, and optionally an annealing chamber 208. In one embodiment, the chambers are all configured to be operatively interfaced with each other such that a semiconductor substrate may be passed from one chamber to another during the barrier layer deposition process. When a new contact barrier layer is formed, the semiconductor substrate is sequentially processed by each of the process chambers depicted herein using the process operating parameters summarized in Table 1 below.

TABLE 1

| Ionized Metal Plasma Deposition | |
|---|---|
| Plasma Power Setting: | DC power ~2000-4000 W; RF power ~2000-4000 W |
| Temperature Setting: | ~100-200° C. |
| Chamber Pressure Setting: | ~10-30 mTorr |
| Barrier Layer Precursor(s): | Ti target plate |
| Metal Organic Chemical Vapor Deposition | |
| Plasma Power Setting: | RF power ~750 W |
| Temperature Setting: | ~350-450° C. |
| Chamber Pressure Setting: | ~1.5 Torr |
| Barrier Layer Precursor(s): | TDMAT, TDEAT, NH$_3$, etc. |
| Thermal Chemical Vapor Deposition | |
| Plasma Power Setting: | N/A |
| Temperature Setting: | ~550-700° C. |
| Chamber Pressure Setting: | ~0.5-10 Torr |
| Barrier Layer Precursor(s): | TiCl$_4$, NH$_3$, etc. |

The IMP chamber 202 is configured to deposit a layer of Ti with a thickness of between about 10 Å and about 1000 Å onto the surface of the semiconductor substrate. Typically, the Ti layer is comprised of titanium silicide (TiSi$_2$) and its equivalent analogues. In one embodiment, the set-up of an IMP chamber 202 includes a Ti target plate, a plasma source, a pair of electrode plates (cathode and anode), heating element, and a wafer chuck to hold the semiconductor substrate. It should be appreciated, that the IMP chamber 202 set-up configuration described above is to be used for illustrative purposes only and is not mean to limit the possible configurations for the IMP chamber 202 in any way. In practice, the IMP chamber 202 may include different components or elements than those described above depending on the needs of the particular application. During a typical Ti deposition operation, charged Argon (Ar) gas ions are accelerated towards the Ti target plate placed substantially over the semiconductor substrate surface to be layered with the Ti layer. The Ar gas ions are accelerated by with sufficient velocity to dislodge (i.e., sputter) Ti atoms from the Ti target plate using the cathode electrode placed substantially behind the Ti target plate. Ti atoms are sputtered due to the impact momentum of the impinging Ar gas ions and their interaction with the Ti target plate material structure or lattice. Once dislodged, the Ti atoms are ionized by the plasma source and then deposited on the Si surface of the semiconductor substrate.

Argon is the typical elemental ion species used to sputter the Ti atoms off of the Ti target plate. However, it should be understood that other elemental ion species may also be utilized, such as helium gas, as long as the chosen elemental ion can be imparted with enough momentum to sputter sufficient quantities of Ti atoms from the Ti target plate during the IMP deposition process for the particular application.

In one embodiment, the IMP chamber 202 is configured to operate at a temperature setting of between about 75 Celsius (° C.) and about 300° C. In another embodiment, the IMP chamber 202 is configured to operate at a temperature setting of between about 100° C. and about 200° C. It should be appreciated, however, that the IMP chamber 202 may be configured to operate at any temperature setting as long as the IMP deposition process can deposit a substantially uniform layer of Ti onto the surface of the semiconductor substrate with the required thickness for the particular application.

In one embodiment, the IMP chamber 202 is configured to operate with a chamber pressure setting of between about 5 millitorr (mTorr) and about 50 mTorr. In another embodiment, the IMP chamber 202 is configured to be operated with a chamber pressure setting of between about 10 mTorr and about 30 mTorr. It should be appreciated, however, that the IMP chamber 202 may be configured to operate with any pressure setting as long as the IMP deposition process can deposit a substantially uniform layer of Ti on the surface of the semiconductor substrate with the required thickness for the particular application.

In one embodiment, the IMP chamber 202 uses a plasma source that operates in a RF mode with a power setting of between about 2000 Watts (W) and about 4000 W to strike the plasma in the chamber. In another embodiment, the IMP chamber 202 uses a plasma source that operates in a DC mode with a power setting of between about 2000 W and about 4000 W to strike the plasma in the chamber 202. It should be understood, however, that the plasma source can be operated in any type of mode as long as the plasma source can be used to strike a quantity of plasma that is sufficient for the particular application.

In one embodiment, the plasma source is an inductively coupled plasma (ICP) source. In another embodiment the plasma source is a capacitative plasma source. In still another embodiment, plasma source is a magnetronic plasma source. It should be appreciated, however, that any type of plasma source may be used as long as the source can be configured to strike a quantity of plasma that is sufficient for the particular application.

Continuing with FIG. 2, the MOCVD chamber 204 is configured to deposit a first layer of TiN with a thickness of between about 1 Å and about 100 Å onto the surface of the Ti layer. In one embodiment, the set-up of the chamber 204 includes a plasma source, a vacuum pump, a gas injection unit, a heating element, and a wafer chuck to hold the semiconductor substrate. It should be appreciated, that the MOCVD chamber 204 set-up configuration described above is to be used for illustrative purposes only and is not mean to limit the possible configurations for the MOCVD chamber 204 in any way. In practice, the MOCVD chamber 204 may include different components or elements than those described above depending on the needs of the particular application. During the typical operation of the MOCVD chamber 204 to deposit a TiN layer onto a Ti layer, an organic precursor gas and ammonia ($NH_3$) gas is supplied through the gas injection unit into the chamber 204. The organic precursor gas and ammonia gas react to form TiN molecules that are deposited on the surface of the semiconductor substrate to form the first layer of TiN molecules. As the TiN formed by the MOCVD process typically contains impurities, the TiN layer is treated with a hydrogen/nitrogen gas mixture and a quantity of plasma to remove the impurities.

In one embodiment, the organic precursor gas is TDMAT. In another embodiment, the organic precursor gas is TDEAT. It should be understood, however, that the organic precursor gas can be any chemical species as long as the chemical species can react with ammonia within the controlled environment of the MOCVD chamber 204 to form a TiN layer with the required thickness for the particular application.

In one embodiment, the MOCVD chamber 204 is configured to operate at a temperature setting of between about 300° C. and about 500° C. In another embodiment, the MOCVD chamber 204 is configured to operate at a temperature setting of between about 350° C. and about 450° C. It should be appreciated, however, that the MOCVD chamber 204 may be configured to operate at any temperature setting as long as the MOCVD deposition process can deposit a substantially uniform first layer of TiN onto the surface of the Ti layer with the required thickness for the particular application.

In one embodiment, the MOCVD chamber 204 is configured to operate with a chamber pressure setting of between about 1 Torr and about 2 Torr. In another embodiment, the MOCVD chamber 204 is configured to be operated with a chamber pressure setting of about 1.5 Torr. It should be appreciated, however, that the MOCVD chamber 204 may be configured to operate with any pressure setting as long as the MOCVD deposition process can deposit a substantially uniform first layer of TiN onto the surface of the Ti layer with the required thickness for the particular application.

In one embodiment, the MOCVD chamber 204 uses a plasma source that operates in a RF mode with a power setting of about 750 Watts to strike the plasma in the chamber. It should be appreciated, however, that the plasma source can be operated with any power setting as long as the quantity of plasma generated by the plasma source results in the deposition of a first layer of TiN onto the surface of the Ti layer with the required thickness for the particular application.

Still with FIG. 2, the thermal CVD chamber 206 is configured to deposit a second layer of TiN with a thickness of between about 10 Å and about 750 Å onto the surface of the first layer of TiN. During a typical operation of the thermal CVD chamber 206 to deposit the second layer of TiN onto a first layer of TiN, titanium tetrachloride ($TiCl_4$) gas and ammonia are supplied into the thermal CVD chamber 206. The chamber 206 is then heated to a set temperature to initiate a reaction between the $TiCl_4$ gas and the ammonia gas to produce TiN that is deposited onto the first layer of TiN to form the second layer of TiN.

In one embodiment, the thermal CVD chamber 206 is configured to operate at a temperature setting of between about 500° C. and about 1000° C. In another embodiment, the thermal CVD chamber 206 is configured to operate at a temperature setting of between about 550° C. and about 700° C. It should be appreciated, however, that the thermal CVD chamber 206 may be configured to operate at any temperature setting as long as the thermal CVD deposition process can deposit a substantially uniform second layer of TiN onto the surface of the first layer of TiN with the required thickness for the particular application.

In one embodiment, the thermal CVD chamber 206 is configured to operate with a chamber pressure setting of between about 0.1 Torr and about 20 Torr. In another embodiment, the thermal CVD chamber 206 is configured to be operated with a chamber pressure setting of between about 0.5 Torr and about 10 Torr. It should be appreciated, however, that the thermal CVD chamber 206 may be configured to operate with any pressure setting as long as the thermal CVD deposition process can deposit a substantially uniform second layer of TiN onto the surface of the first layer of TiN with the required thickness for the particular application.

Following the deposition of the second layer of TiN on top of the first layer of TiN, the thermal CVD chamber 206 can be configured to anneal (heat) the completed contact barrier layer (i.e., Ti/TiN/TIN), in the presence of nitrogen (N2), to remove impurities and increase the overall density of the barrier layer. In one embodiment, the thermal CVD chamber 206 is configured to effectuate a rapid thermal processing (RTP) operation whereby the contact barrier layer is rapidly heated to a temperature of between about 550° C. and about 750° C. for a time period of about 10 seconds to 2 minutes. In another embodiment, the thermal CVD chamber 206 is configured to gradually heat the barrier layer to a temperature of between about 500° C. to about 700° C. for a time period of between about 20 seconds to about 5 minutes.

In an alternative embodiment (and configuration) of system 200, a separate annealing chamber 208 can be operatively interfaced to the thermal chemical vapor deposition (CVD) chamber. As discussed above, the annealing chamber is configured to anneal (heat) the contact barrier layer (i.e., Ti/TiN/TiN layer) on the substrate to remove impurities and increase the density of the barrier layer. In one embodiment, the annealing chamber 208 is configured to effectuate a rapid thermal processing (RTP) operation whereby the contact barrier layer is rapidly heated to a temperature of between about 550° C. and about 750° C. for a time period of about 10 seconds to 2 minutes. In another embodiment, the annealing chamber 208 is configured to gradually heat the barrier layer to a temperature of between about 500° C. to about 700° C. for a time period of between about 20 seconds to about 5 minutes.

Figure 3A:
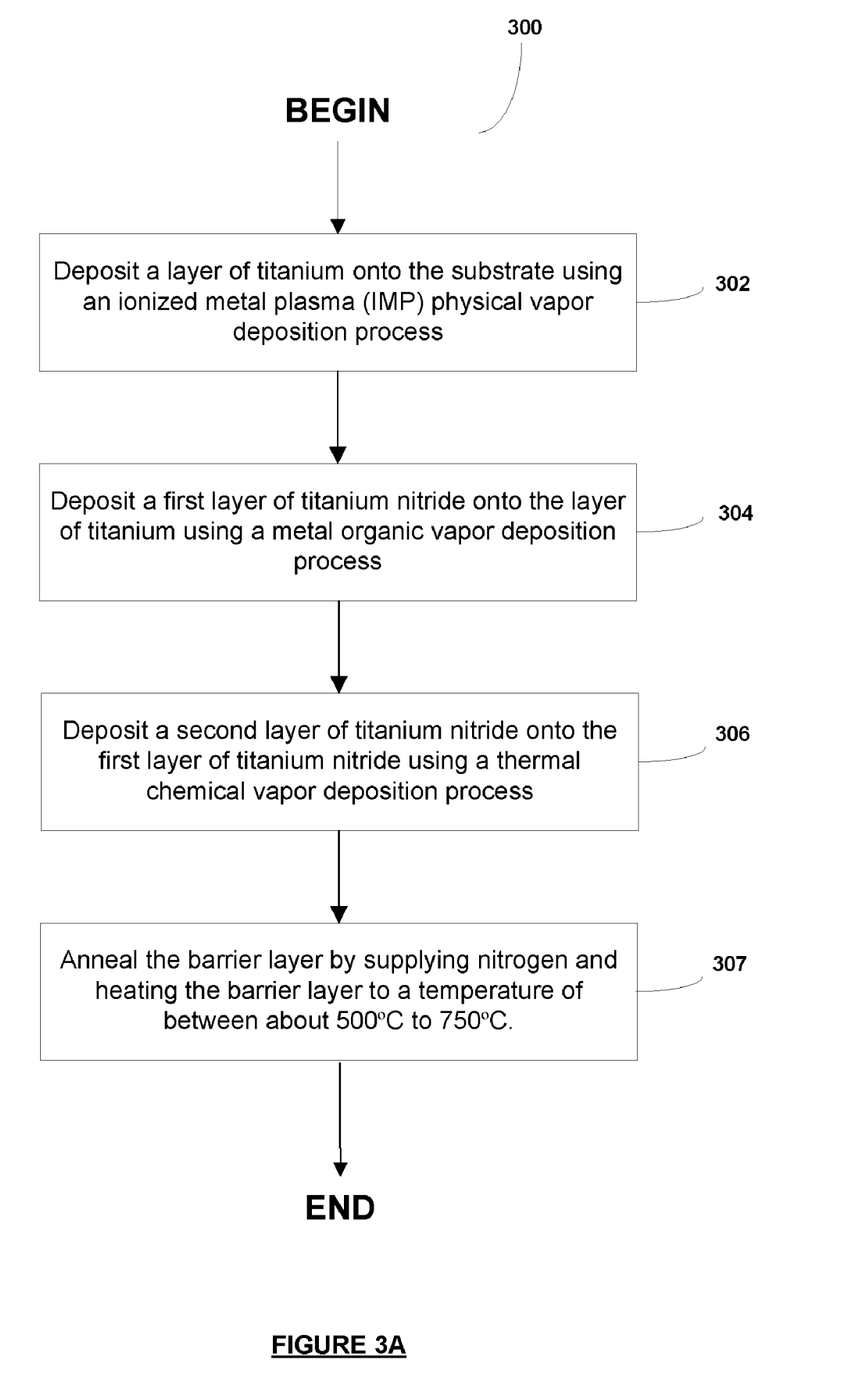
FIG. 3A is a flowchart of a method to form a new contact barrier layer onto a semiconductor substrate, in accordance with one embodiment.

FIG. 3A is a flowchart of a method to form a new contact barrier layer onto a semiconductor substrate, in accordance with one embodiment. Diagrams depicting the cross-sectional layout of the contact barrier layer and the system utilized in this method are shown in FIGS. 1 and 2, respectively. Method 300 begins with operation 302 where a layer of titanium is deposited onto the surface of a semiconductor substrate using an IMP physical vapor deposition process. Typically, the titanium layer is comprised of titanium silicide ($TiSi_2$) and its equivalent analogues. In one embodiment, the layer of Ti has a thickness of about 10 Å and about 1000 Å. In another embodiment, the thickness of the Ti layer is between about 50 Å and about 750 Å. In still another embodiment, the thickness of the Ti layer is between about 50 Å and about 450 Å. It should be appreciated, however, that the Ti layer can be formed to any thickness as long as the Ti layer does not impair the function or reliability of the IC components defined on the semiconductor substrate.

Method 300 moves on to operation 304 where a first layer of TiN is deposited onto the surface of the Ti layer using a MOCVD process. In one embodiment, the thickness of the first TiN layer is between about 1 Å and about 100 Å. In another embodiment, the thickness of the first TiN layer is between about 5 Å and about 300 Å. In still another embodiment, the thickness of the first TiN layer is between about 10 Å and about 25 Å. It should be understood, however, that the first TiN layer can be formed to any thickness as long as the first TiN layer does not impair the function or reliability of the IC components defined on the semiconductor substrate.

Method 300 continues on to operation 306 where a second layer of TiN is deposited onto the surface of the first TiN layer using a thermal CVD process. In one embodiment, the thickness of the second TiN layer is between about 10 Å and about 750 Å. In another embodiment, the thickness of the second TiN layer is between about 25 Å and about 500 Å. In still another embodiment, the thickness of the second TiN layer is between about 50 Å and about 300 Å. It should be understood, however, that the second TiN layer can be formed to any thickness as long as the second TiN layer does not impair the function or reliability of the IC components (e.g., metal interconnects, etc.) defined on the semiconductor substrate.

Method 300 proceeds on to operation 307 where the completed contact barrier layer (i.e., Ti/TiN/TiN) is annealed in the presence of nitrogen at a temperature of between about 500° C. to about 750° C. in order to remove impurities from the barrier layer and increase its density. In one embodiment, the contact barrier layer is annealed using a rapid thermal processing (RTP) operation whereby the contact barrier layer is rapidly heated to a temperature of between about 550° C. and about 750° C. for a time period of about 10 seconds to 2 minutes. In another embodiment, the contact barrier layer is annealed using a furnace operation that gradually heats the barrier layer to a temperature of between about 500° C. to about 700° C. for a time period of between about 20 seconds to about 5 minutes. It should be appreciated, however, that the annealing operation can occur after the deposition of the either the first TiN layer or the second TiN layer, depending on the requirements of the particular application.

Figure 3B:
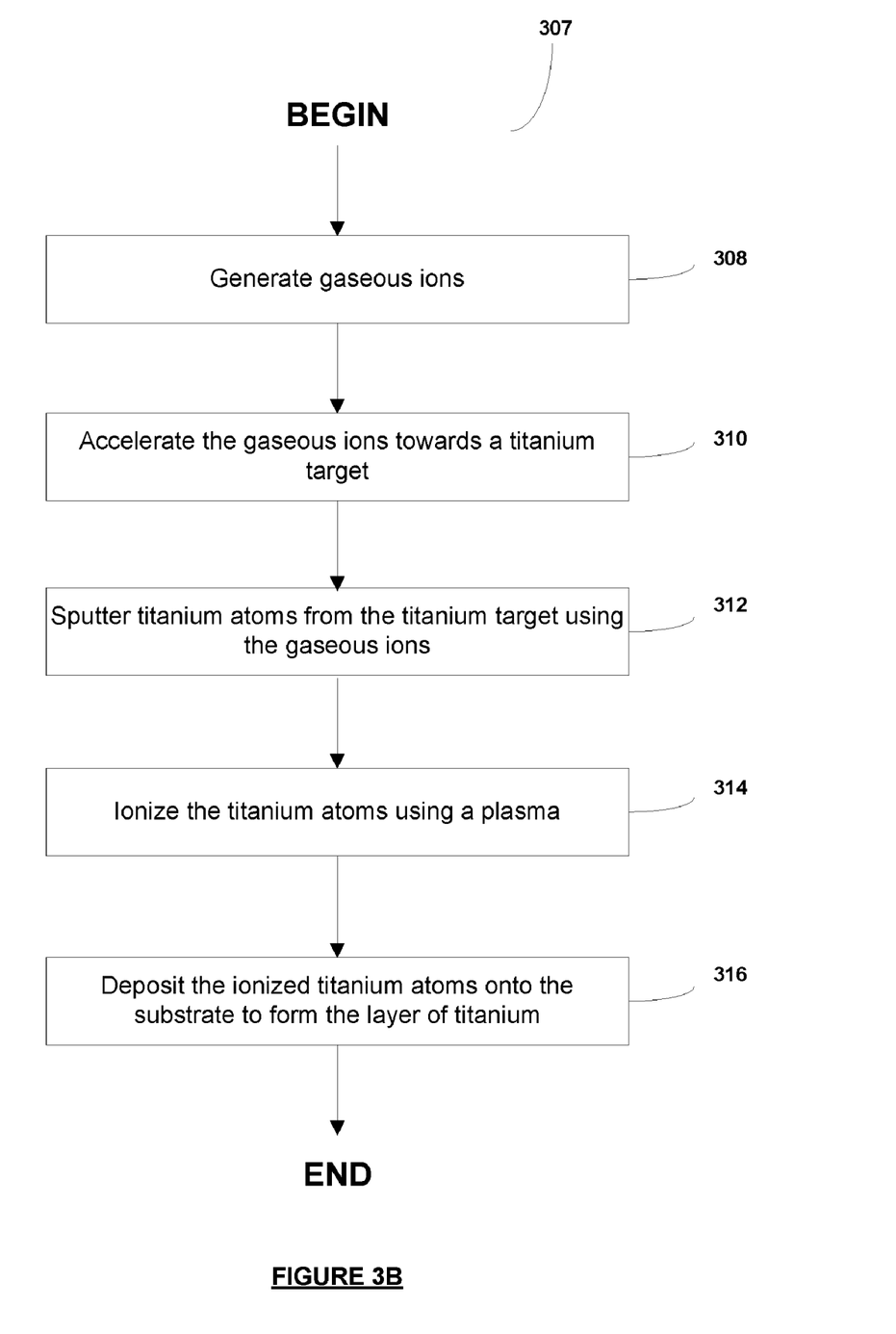
FIG. 3B is a flowchart detailing the operation of the ionized metal plasma (IMP) physical vapor deposition chamber to form a layer of Ti on a semiconductor substrate, in accordance with one embodiment.

FIG. 3B is a flowchart detailing the operation of the IMP physical vapor deposition chamber to form a layer of Ti on a semiconductor substrate, in accordance with one embodiment. Method 307 begins with operation 308 where gaseous ions are generated in the IMP chamber. In one embodiment, the gaseous ions are comprised of argon gas ions or helium gas ions. It should be appreciated, however, that other elemental ion species may also be utilized as long as the chosen elemental ion can be imparted with enough momentum to sputter sufficient quantities of Ti atoms from the Ti target plate during the IMP deposition process for the particular application.

The method 307 proceeds to operation 310 where the gaseous ions are accelerated towards a titanium target. A cathode electrode placed substantially behind the Ti target plate operates to supply the attractive forces to accelerate the gaseous ions. Thus, the velocity of the gaseous ions can be controlled by adjusting the voltage and polarity of the electrode plate.

The method 307 continues on to operation 312 where the accelerated gaseous ions are used to sputter (i.e., dislodge) Ti atoms from the Ti target plate. As discussed above, the gaseous ions are accelerated with a cathode electrode to reach a final velocity that is sufficient to sputter Ti atoms from the Ti target plate.

The method 307 moves on to operation 314 where the Ti atoms are ionized using a plasma. In one embodiment, the plasma is struck using a plasma source that operates in a RF mode with a power setting of between about 2000 W and about 4000 W to strike the plasma in the chamber. In another embodiment, the plasma is struck using a plasma source that operates in a DC mode with a power setting of between about 2000 W and about 4000 W to strike the plasma in the chamber. It should be understood, however, that the plasma can be struck using a plasma source that is operated in any mode as long as the plasma source can be used to strike a quantity of plasma that is sufficient for the particular application. Method 307 progresses on to operation 316 where the ionized Ti atoms are deposited onto the semiconductor substrate to form the Ti layer. The thickness range for the Ti layer is described above.

Figure 3C:
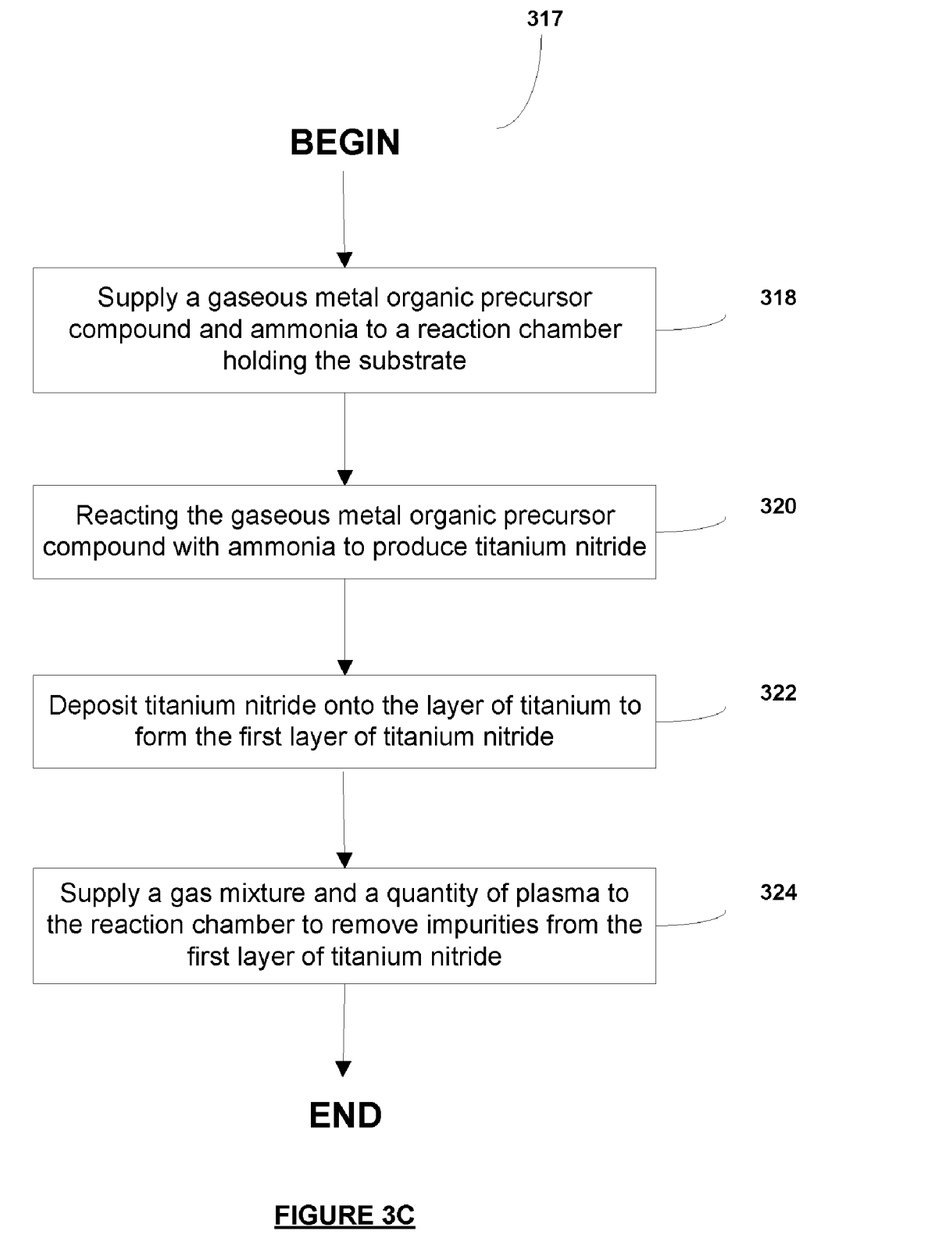
FIG. 3C is a flowchart detailing the operation of the metal organic chemical vapor deposition (MOCVD) chamber to form a first layer of TiN on the surface of a Ti layer, in accordance with one embodiment.

FIG. 3C is a flowchart detailing the operation of the MOCVD chamber to form a first layer of TiN on the surface of a Ti layer, in accordance with one embodiment. Diagrams depicting the cross-sectional layout of the contact barrier layer and the system utilized in this method are shown in FIGS. 1 and 2, respectively. Method 317 begins with operation 318 where a gaseous metal organic precursor compound and ammonia are supplied to the MOCVD chamber holding the semiconductor substrate.

In one embodiment, the organic precursor compound is TDMAT. In another embodiment, the organic precursor compound is TDEAT. It should be understood, however, that the organic precursor compound can be any chemical species as long as the chemical species can react with ammonia within the controlled environment of the MOCVD chamber to form a TiN layer with the required thickness for the particular application.

The method 317 proceeds to operation 320 where the gaseous metal organic precursor compound is reacted with ammonia to produce TiN. Moving on to operation 322, the TiN is deposited onto the surface of the Ti layer to form the first layer of TiN. The thickness of the first Ti layer formed is a function of the concentration of organic precursor compound and ammonia gas introduced into the MOCVD chamber.

The method continues on to operation 324 where a gas mixture and a quantity of plasma is supplied to the reaction chamber to remove impurities from the first TiN layer. In one embodiment, the gas mixture is a hydrogen/nitrogen gas mixture. In one embodiment, the MOCVD chamber uses a plasma source that operates in a RF mode with a power setting of about 750 Watts to strike the plasma in the chamber. It should be appreciated, however, that the plasma source can be operated with any power setting as long as the quantity of plasma generated by the plasma source is sufficient to substantially remove any undesired impurities bound to the first TiN layer.

Figure 3D:
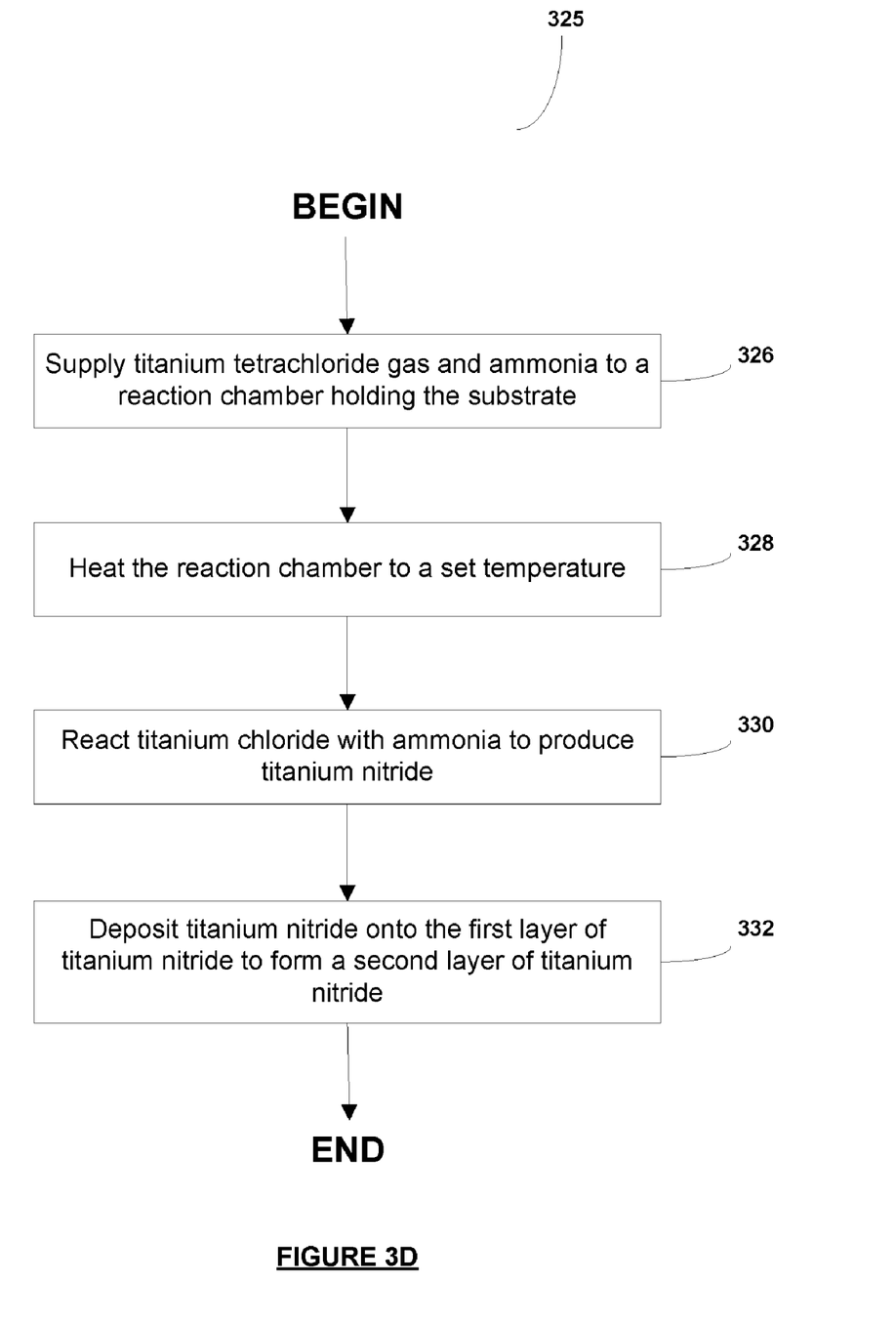
FIG. 3D is a flowchart detailing the operation of the thermal chemical vapor deposition (CVD) chamber to form a second layer of TiN on the surface of a first TiN layer, in accordance with one embodiment.

FIG. 3D is a flowchart detailing the operation of the thermal CVD chamber to form a second layer of TiN on the surface of a first TiN layer, in accordance with one embodiment. Diagrams depicting the cross-sectional layout of the contact barrier layer and the system utilized in this method are shown in FIGS. 1 and 2, respectively. Method 325 begins with operation 326 where $TiCl_4$ and ammonia gas is supplied to the reaction chamber holding the semiconductor substrate.

The method 325 proceeds to operation 328 where the reaction chamber is heated to a set temperature. In one embodiment, the reaction chamber is configured to operate at a temperature setting of between about 500° C. and about 1000° C. In another embodiment, the reaction chamber is configured to operate at a temperature setting of between about 550° C. and about 700° C. It should be appreciated, however, that the reaction chamber may be configured to operate at any temperature setting as long as the thermal CVD deposition process can deposit a substantially uniform second layer of TiN onto the surface of the first layer of TiN with the required thickness for the particular application.

Contemporaneous with the heating of the reaction chamber in operation 328, the method continues on to operation 330 where the TiCl$_4$ is reacted with ammonia to produce TiN. After the TiN is produced, the method 325 moves on to operation 332 where the TiN is deposited onto the first layer of TiN to form a second layer of TiN.

Although a few embodiments of the present invention have been described in detail herein, it should be understood, by those of ordinary skill, that the present invention may be embodied in many other specific forms without departing from the spirit or scope of the invention. Therefore, the present examples and embodiments are to be considered as illustrative and not restrictive, and the invention is not to be limited to the details provided therein, but may be modified and practiced within the scope of the appended claims.

What is claimed is:

1. A method for depositing a barrier layer onto a substrate, comprising:
    depositing a layer of titanium (Ti) onto the substrate using an ionized metal plasma (IMP) physical vapor deposition process, wherein the IMP physical vapor deposition process includes,
        generating gaseous ions,
        accelerating the gaseous ions towards a titanium target,
        sputtering titanium atoms from the titanium target using the gaseous ions,
        ionizing the titanium atoms using a plasma, and
        depositing the ionized titanium atoms onto the substrate to form the layer of Ti;
    depositing a first layer of titanium nitride (TiN) onto the layer of Ti using a metal organic chemical vapor deposition (MOCVD) process;
    depositing a second layer of TiN onto the first layer of TiN using a thermal chemical vapor deposition (CVD) process using titanium tetrachloride (TiCl4) gas and ammonia (NH3); and
    performing an annealing process in the presence of nitrogen (N2) and heating to a temperature of between about 500 Celsius (° C.) to about 750° C.

2. The method for depositing a barrier layer onto a substrate, as recited in claim 1, wherein the Ti layer is comprised of titanium silicide (TiSi2).

3. The method for depositing a barrier layer onto a substrate, as recited in claim 1, wherein the barrier layer is heated using rapid thermal processing (RTP) for a time period of between about 10 seconds (s) to about 120 s.

4. The method for depositing a barrier layer onto a substrate, as recited in claim 1, wherein the barrier layer is heated using a furnace for a time period of between about 20 seconds to about 5 minutes.

5. The method for depositing a barrier layer onto a substrate, as recited in claim 1, wherein the gaseous ions is argon.

6. The method for depositing a barrier layer onto a substrate, as recited in claim 1, wherein the gaseous ions is helium.

7. The method for depositing a barrier layer onto a substrate, as recited in claim 1, wherein the layer of Ti has a thickness of between about 50 Å and about 450 Å.

8. The method for depositing a barrier layer onto a substrate, as recited in claim 1, wherein the first layer of TiN has a thickness of between about 5 angstroms (Å) and about 200 Å.

9. The method for depositing a barrier layer onto a substrate, as recited in claim 1, wherein the second layer of TiN has a thickness of between about 50 Å and about 300 Å.

10. The method for depositing a barrier layer onto a substrate, as recited in claim 1, wherein the plasma is generated by a radio frequency (RF) plasma source.

11. The method for depositing a barrier layer onto a substrate, as recited in claim 10, wherein the RF plasma source is operated using a power setting of between about 2000 Watts (W) and about 4000 W.

12. The method for depositing a barrier layer onto a substrate, as recited in claim 1, wherein the plasma is generated by an inductively coupled plasma source.

13. The method for depositing a barrier layer onto a substrate, as recited in claim 12, wherein the inductively coupled plasma source is operated using a power setting of between about 2000 W and about 4000 W.

14. The method for depositing a barrier layer onto a substrate, as recited in claim 1, wherein the IMP physical vapor deposition process occurs under a temperature setting of between about 100 degrees Celsius (° C.) and about 200 ° C.

15. A method for depositing a barrier layer onto a substrate, comprising:
    depositing a layer of titanium (Ti) onto the substrate using an ionized metal plasma (IMP) physical vapor deposition process;
    depositing a first layer of titanium nitride (TiN) onto the layer of Ti using a metal organic chemical vapor deposition (MOCVD) process, wherein the MOCVD process includes,
        supplying a gaseous metal organic precursor compound and ammonia (NH3) to a reaction chamber holding the substrate,
        reacting the gaseous metal organic precursor compound with ammonia (NH3) to produce TiN,
        depositing TiN onto the layer of Ti to form the first layer of TiN, and
        supplying a gas mixture and a quantity of plasma to the reaction chamber to remove impurities from the first layer of TiN;
    depositing a second layer of TiN onto the first layer of TiN using a thermal chemical vapor deposition (CVD) process using titanium tetrachloride (TiCl4) gas and ammonia (NH3); and
    performing an annealing process in the presence of nitrogen (N2) and heating to a temperature of between about 500 Celsius (° C.) to about 750° C.

16. The method for depositing a barrier layer onto a substrate, as recited in claim 15, wherein the Ti layer is comprised of titanium silicide (TiSi2).

17. The method for depositing a barrier layer onto a substrate, as recited in claim 15, wherein the barrier layer is heated using rapid thermal processing (RTP) for a time period of between about 10 seconds (s) to about 120 s.

18. The method for depositing a barrier layer onto a substrate, as recited in claim 15, wherein the barrier layer is heated using a furnace for a time period of between about 20 seconds to about 5 minutes.

19. The method for depositing a barrier layer onto a substrate, as recited in claim 15, wherein the layer of Ti has a thickness of between about 50 Å and about 450 Å.

20. The method for depositing a barrier layer onto a substrate, as recited in claim 15, wherein the first layer of TiN has a thickness of between about 5 Å and about 300 Å.

21. The method for depositing a barrier layer onto a substrate, as recited in claim 15, wherein the second layer of TiN has a thickness of between about 50 Å and about 300 Å.

22. The method for depositing a barrier layer onto a substrate, as recited in claim 15, wherein the quantity of plasma is generated using a radio frequency (RF) plasma source.

23. The method for depositing a barrier layer onto a substrate, as recited in claim 22, wherein the RF plasma source is operated using a power setting about 750 W.

24. The method for depositing a barrier layer onto a substrate, as recited in claim 15, wherein the gaseous metal organic precursor compound is Tetrakis Dimethylamino Titanium (TDMAT).

25. The method for depositing a barrier layer onto a substrate, as recited in claim 15, wherein the gaseous metal organic precursor compound is Tetrakis Diethylamido Titanium (TDEAT).

26. The method for depositing a barrier layer onto a substrate, as recited in claim 15, wherein the MOCVD process occurs under a temperature setting of between about 350° C. and about 450° C.

27. The method for depositing a barrier layer onto a substrate, as recited in claim 15, wherein the gas mixture includes nitrogen (N2) gas and hydrogen (H2) gas.

28. A method for depositing a barrier layer onto a substrate, comprising:
   depositing a layer of titanium (Ti) onto the substrate using an ionized metal plasma (IMP) physical vapor deposition process;
   depositing a first layer of titanium nitride (TiN) onto the layer of Ti using a metal organic chemical vapor deposition (MOCVD) process; and
   depositing a second layer of TiN onto the first layer of TiN using a thermal chemical vapor deposition process, wherein the thermal chemical vapor deposition (CVD) process includes,
      supplying titanium tetrachloride (TiCl4) gas and ammonia (NH3) to a reaction chamber holding the substrate,
      heating the reaction chamber to a set temperature,
      reacting TiCl4 with NH3 to produce TiN, and
      depositing TiN onto the first layer of TiN to form the second layer of TiN; and
   performing an annealing process in the presence of nitrogen (N2) and heating to a temperature of between about 500 Celsius (° C.) to about 750° C.

29. The method for depositing a barrier layer onto a substrate, as recited in claim 28, wherein the step of the annealing the barrier layer is operated before the step of depositing a second layer of TiN onto the first layer of TiN using a thermal chemical vapor deposition process.

30. The method for depositing a barrier layer onto a substrate, as recited in claim 28, wherein the Ti layer is comprised of titanium silicide (TiSi2).

31. The method for depositing a barrier layer onto a substrate, as recited in claim 28, wherein the barrier layer is heated using rapid thermal processing (RTP) for a time period of between about 10 seconds to about 120 seconds.

32. The method for depositing a barrier layer onto a substrate, as recited in claim 28, wherein the barrier layer is heated using a furnace for a time period of between about 20 seconds to about 5 minutes.

33. The method for depositing a barrier layer onto a substrate, as recited in claim 28, wherein the layer of Ti has a thickness of between about 50 Å and about 450 Å.

34. The method for depositing a barrier layer onto a substrate, as recited in claim 28, wherein the first layer of TiN has a thickness of between about 5 Å and about 300 Å.

35. The method for depositing a barrier layer onto a substrate, as recited in claim 28, wherein the second layer of TiN has a thickness of between about 50 Å and about 300 Å.

36. The method for depositing a barrier layer onto a substrate, as recited in claim 28, wherein the set temperature is between about 550° C. and about 700° C.

37. A method for depositing a barrier layer onto a substrate, comprising:
   depositing a layer of titanium (Ti) onto the substrate using an ionized metal plasma (IMP) physical vapor deposition process, wherein the layer of Ti has a thickness of between about 10 Å and about 1000 Å;
   depositing a first layer of titanium nitride (TiN) onto the layer of Ti using a metal organic chemical vapor deposition (MOCVD) process, wherein the first layer of TiN has a thickness of between about 1 Å and about 100 Å;
   depositing a second layer of TiN onto the first layer of TiN using a thermal chemical vapor deposition process using titanium tetrachloride (TiCl4) gas and ammonia (NH3), wherein the second layer of TiN has a thickness of between about 10 Å and about 750 Å; and
   performing an annealing process in the presence of nitrogen (N2) and heating to a temperature of between about 500 Celsius (° C.) to about 750° C. for a period of between about 20 seconds (s) to about 7200 s.

38. The method for depositing a barrier layer onto a substrate, as recited in claim 37, wherein the step of the annealing the barrier layer is operated before the step of depositing a second layer of TiN onto the first layer of TiN using a thermal chemical vapor deposition process.

39. A method for depositing a barrier layer onto a substrate, comprising:
   depositing a layer of titanium (Ti) onto the substrate using an ionized metal plasma (IMP) physical vapor deposition process;
   depositing a first layer of titanium nitride (TiN) onto the layer of Ti using a metal organic chemical vapor deposition (MOCVD) process;
   depositing a second layer of TiN onto the first layer of TiN using a thermal chemical vapor deposition process using titanium tetrachloride (TiCl4) gas and ammonia (NH3), and
   performing an annealing process in the presence of nitrogen (N2).

* * * * *